(12) United States Patent
Souri et al.

(10) Patent No.: US 6,181,541 B1
(45) Date of Patent: *Jan. 30, 2001

(54) TRANSISTOR-PTC CIRCUIT PROTECTION DEVICES

(76) Inventors: Shukri Souri, 919 Mowry Ave. #41, Fremont, CA (US) 94536; Hugh Duffy, 10565 San Leandro Ave., Cupertino, CA (US) 95014; Adrian I. Cogan, P.O. Box 522, San Carlos, CA (US) 94065; Mark Munch, 850 Rorke Way, Palo Alto, CA (US) 94063; Nick Nickols, P.O. Box 671, Los Gatos, CA (US) 95031

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/177,795

(22) Filed: Oct. 22, 1998

(51) Int. Cl.$^7$ ....................................... H02H 5/04
(52) U.S. Cl. ................. 361/106; 361/93.8; 361/93.9; 361/58; 361/101
(58) Field of Search ................... 361/106, 103, 361/93.8, 93.9, 93.1, 58, 100–101, 10, 98, 27; 338/20, 22 R

(56) References Cited

U.S. PATENT DOCUMENTS

| | | | |
|---|---|---|---|
| 3,708,720 | 1/1973 | Whitney et al. | 317/13 C |
| 3,884,080 | * 5/1975 | Chapman | 73/755 |
| 4,041,276 | 8/1977 | Schwarz et al. | 219/308 |
| 4,281,358 | 7/1981 | Plouffe et al. | 361/22 |
| 4,295,088 | 10/1981 | Malchow | 323/313 |
| 5,381,296 | * 1/1995 | Ekelund et al. | 361/106 |
| 5,684,663 | 11/1997 | Mitter | 361/106 |
| 5,763,929 | * 6/1998 | Iwata | 257/467 |

FOREIGN PATENT DOCUMENTS

| | | |
|---|---|---|
| 2249463 | 5/1975 | (FR) . |
| 94/11937 | 5/1994 | (WO) . |

OTHER PUBLICATIONS

International Search Report for International Application No. PCT/US99/24716 dated Feb. 18, 2000.

* cited by examiner

*Primary Examiner*—Michael J. Sherry

(57) ABSTRACT

A circuit protection device for protecting an electrical load includes a three-terminal switch element such as a bipolar, or junction or metal-oxide-semiconductor field effect, transistor and a positive temperature compensation (PTC) resistor. In several embodiments the PTC resistor is in series with the current-carrying electrodes of the transistor. In other embodiments the PTC resistor, or a second PTC resistor, is connected to a control element of the transistor. Both DC and AC load-protection circuits are described.

34 Claims, 2 Drawing Sheets

Rg=100Ω    Rs=1Ω

Thermal Linking

TRANSISTOR-PTC CIRCUIT PROTECTION DEVICES

BACKGROUND OF THE INVENTION

The present invention generally relates to electronic circuits, and more particularly to circuit protection devices comprising a resistor with a positive temperature coefficient (PTC), referred to as PTC_r, operating in combination with a semiconductor device.

PTC_r circuit protection devices are well known. The device is placed in series with a load, and under normal operating conditions, is in a low temperature, low resistance state. However, if the current through the PTC_r device increases excessively, and/or the ambient temperature around the PTC_r device increases excessively, then the PTC_r device will be "tripped," i.e., converted to a high resistance state such that the current is reduced substantially to a safe level. Generally, the PTC_r device will remain in the tripped state, even if the fault is removed, until the device has been disconnected from the power source and allowed to cool. After the current and/or temperature return to their normal levels, the PTC_r device will switch back to the low temperature, low resistance state.

An example of a PTC_r composition device is one that contains a PTC_r which is composed of a PTC conductive polymer. The largest steady state current which will not cause any of the devices in a batch of devices to trip is referred to as the "hold current" ($I_{hold}$), and the smallest steady state current which will cause all of the devices to trip is referred to as the "trip current" ($I_{trip}$). In general, the difference between $I_{hold}$ and $I_{trip}$ decreases slowly as the ambient temperature increases, and the higher the ambient temperature, the lower the hold current and the trip current.

PTC and semiconductor devices have been used together in electrical circuits. In some instances the PTC_r devices have been used to protect the semiconductor devices from overcurrent and/or overtemperature conditions. In other instances, the semiconductor and PTC_r devices have been used together to protect the circuits in which they reside from overcurrent and/or overvoltage conditions.

In many instances, it is desirable to use PTC_r devices in high voltage applications. However, in most cases, the PTC_r device that is operated at its normal current generally has a large size. PTC_r devices of large size are not suitable for portable electronic devices in which size and weight are important. PTC_r devices of large size are also not suitable for high density electronics circuits.

SUMMARY OF THE INVENTION

The present invention provides a circuit protection device that has a reduced size and weight and is particularly suitable for use, for example, in portable electronic devices and high density electronic circuits. The present invention also provides design flexibility by allowing adjustment of the ratio of the trip current and the minimum current that flows in the PTC_r device after tripping occurs. The device of the present invention comprises a three-terminal switch element having first, second and third terminals, the first terminal for series connecting to the electrical load; a positive temperature coefficient (PTC) resistor having first and second ends, the first end connected to the third terminal of the switch element; and a voltage divider circuit including first and second resistors, the first resistor connected between a voltage source and the second terminal of the switch element, and the second resistor connected between the second terminal of the switch element and the second end of the PTC resistor.

According to the present invention, the switch element may be a metal-oxide-semiconductor transistor (MOSFET) and the first, second and third terminals of the switch element are drain, gate and source electrodes, respectively. Alternatively, the switch element may be a junction field-effect transistor (JFET) and the first, second and third terminals of the switch element are drain, gate and source electrodes, respectively. The switch element may also be a bipolar junction transistor and the first, second and third terminals of the switch element are collector, base and emitter electrodes, respectively.

Various other embodiments of the invention are disclosed.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DETAILED DESCRIPTION OF THE PREFERRED EMBODIMENTS

Figure 1A:
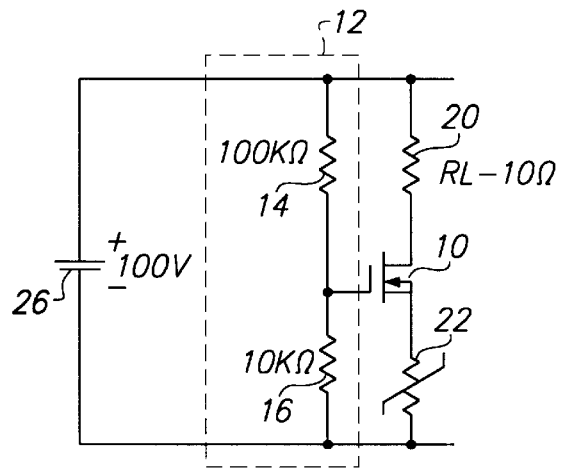
FIG. 1A shows a first embodiment according to the present invention.

FIG. 1A shows a first embodiment according to the present invention. As illustrated, an n-channel, enhancement type metal-oxide-semiconductor field effect transistor (MOSFET) 10 has a gate electrode connected to a bias circuit 12. Bias circuit 12 comprises a voltage divider composed of two resistors 14 and 16. A protection element, such as a positive temperature coefficient (PTC) resistor 22, is connected between a source electrode of MOSFET 10 and ground. An electrical load 20 is connected to a drain electrode of MOSFET 10. A voltage source, such as a battery 26 is connected to bias circuit 12 and load 20.

In this embodiment, as an example, resistors 14, 16 and load 20 have resistance values of 100 kΩ, 10 kΩ and 10 Ω, respectively, and battery 26 has 100 V. The gate electrode of MOSFET 10 is thus biased to about 10 V, while 3 V is sufficient to bias the MOSFET in the ON state. Under normal conditions, since MOSFET 10 is biased in the ON state, current flows through MOSFET 10 and PTC resistor 22. If, as a result of a fault, e.g., a short circuit, the current in PTC resistor 22 exceeds the hold current of the PTC resistor, the PTC resistor starts to trip and becomes a large resistance. The voltage across PTC resistor 22 also increases. When the voltage across PTC resistor 22 reaches 7 volts, the gate voltage of MOSFET 10 is reduced to 3 V relative to its substrate, which turns MOSFET 10 off. Thus, the voltage across PTC resistor 22 will never exceed 7 to 8 V even when the circuit voltage is 100 V. In this embodiment, by changing the resistance values of resistors 14 and 16, the ratio of the trip current and the minimum current that flows in PTC resistor 22, after tripping occurs, can be adjusted.

Figure 1B:
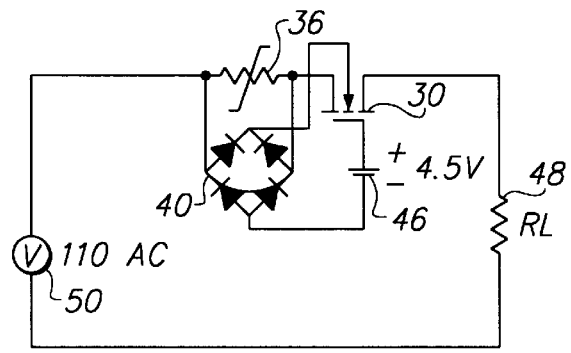
FIG. 1B shows a second embodiment according to the present invention.

FIG. 1B shows a second embodiment according to the present invention. This is a variation of the above embodiment and is for AC operation. As illustrated in FIG. 1B, an n-channel, enhancement type MOSFET 30 has its gate electrode biased by a 4.5 V battery 46 and its source electrode connected to one terminal of a PTC resistor 36. The other terminal of PTC resistor 36 is connected to an AC voltage source 50. An electrical load 48 is connected between the source electrode of MOSFET 30 and AC voltage source 50. A diode bridge rectifier 40 has its input terminals connected across PTC resistor 36 and its output terminals connected between the substrate of MOSFET 30 and battery 46.

Under normal conditions, PTC resistor 36 is conductive and the gate electrode of MOSFET 30 is biased in the ON state by battery 46. If, as a result of a fault, e.g., a short circuit, the current in the PTC resistor 36 exceeds the hold current of the PTC resistor, the PTC resistor begins to trip and becomes a large resistance. In such a case, the voltage at the substrate of MOSFET 30 rises relative to the gate electrode until the voltage difference between the gate electrode and the substrate of MOSFET 30 is just below the value required to bias the MOSFET in the ON state, i.e., 3 V. Rectifier 40 ensures that the gate electrode of MOSFET 40 is always biased positively relative to its substrate.

In this embodiment, PTC resistor 36 and the MOSFET 30 must have a current rating equal to that of the circuit, and the MOSFET 30 must have a voltage rating greater than the supply voltage. However, PTC resistor 36 need only be rated at a few volts.

As a variation of this second embodiment, a depletion type MOSFET can be used instead of the enhancement type MOSFET, which would eliminate the need for biasing battery 46. Also, PTC resistor 36 may be thermally coupled to MOSFET 30 to protect the MOSFET during overpower/overtemperature conditions.

Figure 2A:
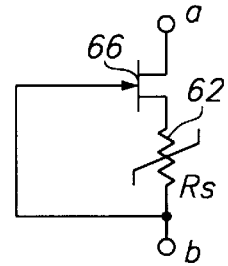
FIG. 2A shows a third embodiment according to the present invention.

FIG. 2A shows a two-terminal source follower circuit according to a third embodiment of the present invention. In this embodiment, a PTC resistor 62 is connected between source and gate electrodes of a depletion type junction field-effect transistor (JFET) 66. A JFET with non-saturated I-V characteristics such as a static induction transistor (SIT) is preferably used. The two-terminal circuit of this embodiment may be used as a series element in generic overcurrent applications, such as by connecting a power load to a drain electrode of JFET 66.

Under normal conditions, PTC resistor 62 is conductive and JFET 66 is in the ON state with a nominal on-resistance, Ron, which is the lowest at Vgs=0. As an example, a JFET designed for 100V operation will exhibit a specific on-resistance of about 4 m$\Omega$.cm$^2$, while a 500V rated JFET will have a specific on-resistance of roughly 75 m$\Omega$.cm$^2$.

If, as a result of a fault, e.g., a short circuit, the current in PTC resistor 62 exceeds its hold current, PTC resistor 62 starts to trip and becomes a large resistance. The voltage developed across the PTC resistor increases and will cause JFET 66 to switch off. As JFET 66 switches off, the JFET withstands most of the supply voltage. Thus, by using this embodiment, low-voltage PTC resistors may be used in higher voltage applications.

In the third embodiment above, PTC resistor 62 may be thermally coupled to JFET 66 to protect the JFET during overpower/overtemperature conditions. Also, various types of power transistors can be used, such as MOSFETs and bipolar junction transistors. In addition, both enhancement and depletion type FETs can be used.

Figure 2B:
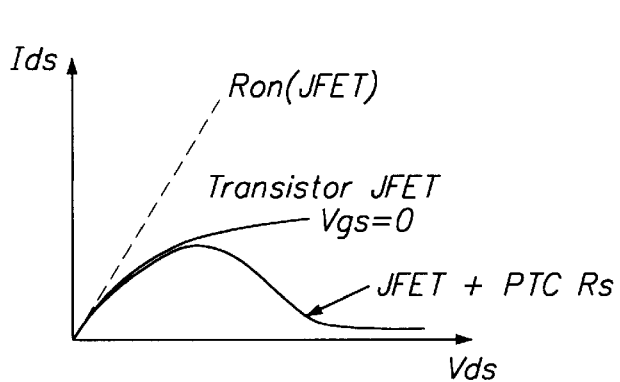
FIG. 2B shows the I-V characteristics of the third embodiment with and without a PTC resistor.

FIG. 2B shows the I-V curves of the JFET, the source follower circuit without the PTC resistor and the source follower circuit with the PTC resistor.

In the third embodiment above, when there is a fault, the voltage drop developed across PTC resistor 72 may exceed the JFET gate-to-source breakdown voltage (BVgs). Thus, a high BVgs device may be used even though it has relatively low voltage gain or transconductance. Low device gain is not detrimental in this application, because the circuit is required to operate only when the PTC resistor has tripped and consequently a significant change in the gate bias has occurred.

In the third embodiment, if the JFET fails short, either due to transient or to long time stress, all the supply voltage will be developed across the PTC resistor, once it has tripped into the high resistance state. The PTC resistor itself will fail after a while. In such a case, a second PTC resistor may be added between the gate electrode of the JFET and the other terminal of the source-connected PTC resistor to improve the circuit reliability and provide additional circuit protection for the JFET gate-to-source region, as illustrated in FIG. 3.

Figure 3:
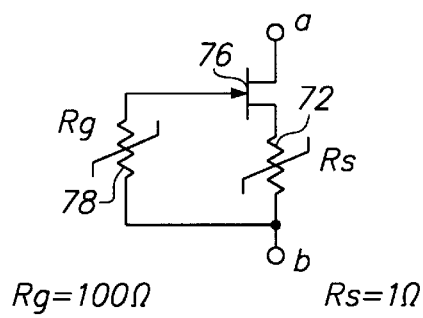
FIG. 3 shows a fourth embodiment according to the present invention.

FIG. 3 shows a fourth embodiment according to the present invention. In this embodiment, a PTC resistor 72 is connected to a source electrode of a JFET 76. A JFET with non-saturated I-V characteristics such as a static induction transistor (SIT) is preferably used. A second PTC resistor 78 is connected between a gate electrode of JFET 76 and PTC resistor 72. PTC resistor 78 preferably has a low temperature resistance several orders of magnitude higher than PTC resistor 72.

In case a transient has sufficient energy to otherwise damage the transistor, PTC resistor 78 will share most of the voltage otherwise imposed upon the JFET gate-to-source region. This will ensure that JFET 76 will remain within its dynamic safe operating area (SOA). PTC resistor 78 will also protect JFET 76 in case the gate-to-source breakdown voltage is exceeded.

In a variation of the fourth embodiment, two PTC resistors 72 and 78 and JFET 76 are coupled thermally, thus providing faster response to the transient power.

Figure 4:
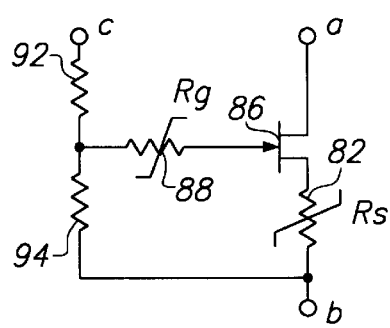
FIG. 4 shows a fifth embodiment according to the present invention.

FIG. 4 illustrates a fifth embodiment according to the present invention. In FIG. 4, a PTC resistor 82 is connected to a source electrode of a JFET 86. A resistor network composed of a PTC resistor 85 and resistors 92 and 94 is connected to JFET 86 and PTC resistor 82. The resistor network provides a separate biasing voltage that can be used to set the protection trigger level (i.e., the trip current), thus expanding the applicability range of the PTC/transistor protection element configuration. This embodiment also provides flexibility in that the voltage range to be applied at terminal c may be adjusted.

Figure 5:
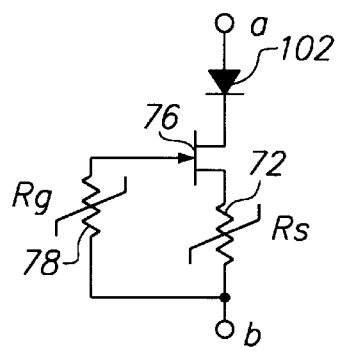
FIG. 5 shows a sixth embodiment according to the present invention.

The circuit configurations described above operate in only one polarity. FIG. 5 shows a sixth embodiment according to the present invention, in which additional protection is provided with a series diode to prevent destruction of the circuit in case the voltage is reversed. This embodiment is similar to the fourth embodiment shown in FIG. 3, except that a diode 102 is added and is connected to a drain electrode of JFET 76. Diode 102 can be monolithically integrated with JFET 76 if a vertical type power JFET is used. This does not add to the FET cost and lowers its on-resistance. Also, PTC resistors 72 and 78 can be fabricated from one single piece of polymeric PTC material and integrated as part of the transistor fabrication cycle.

Figure 6:
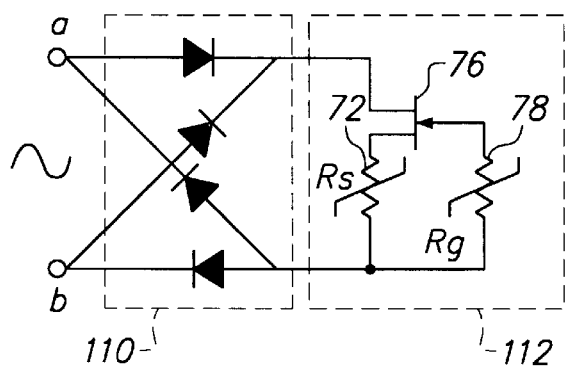
FIG. 6 shows a seventh embodiment according to the present invention.

FIG. 6 shows a seventh embodiment according to the present invention. This embodiment is a variation of the fourth embodiment shown in FIG. 3 and is for AC operation. In this embodiment, a diode bridge 110 is connected to a circuit 112 which is the same as in the fourth embodiment. The seventh embodiment can be used as a two-terminal series component, without requiring a separate biasing source, and can be monolithically integrated.

Figure 7:
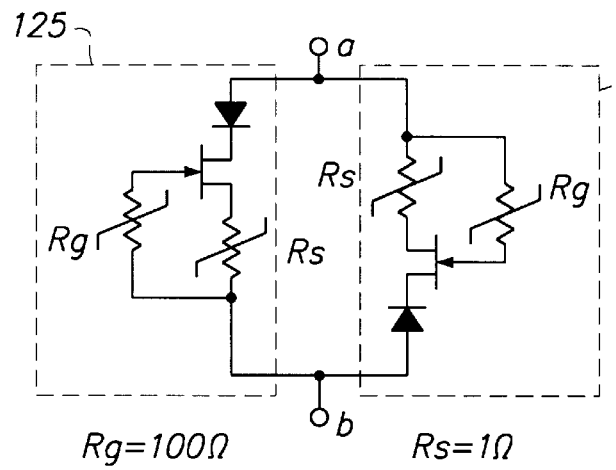
FIG. 7 shows an eighth embodiment according to the present invention.

FIG. 7 shows an eighth embodiment according to the present invention. In this embodiment, two circuits 125 and 127, each being identical to the sixth embodiment shown in FIG. 5, are connected in anti-parallel to provide AC operation.

Figure 8:
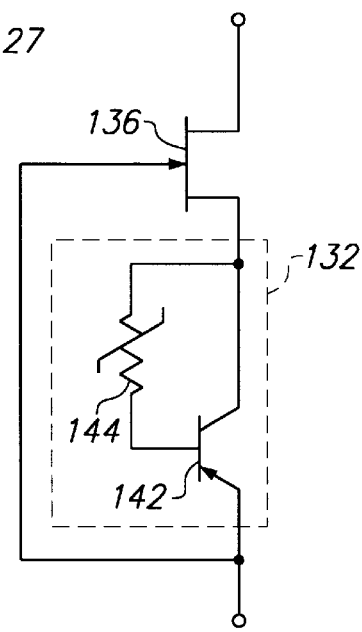
FIG. 8 shows a ninth embodiment according to the present invention.

FIG. 8 shows a ninth embodiment according to the present invention. As illustrated, a protection circuit 132 has one terminal connected to a source terminal of a JFET 136. A JFET with non-saturated I-V characteristics such as a static induction transistor (SIT) is preferably used. The other terminal of protection circuit 132 is connected to a gate electrode of JFET 136. Protection circuit 132 comprises a p-type bipolar transistor 142 and a PTC resistor 144, which is connected between gate and collector terminals of transistor 142. Protection circuit 132 itself acts like a PTC resistor. When the current flowing through PTC resistor 144 exceeds its hold current, the PTC resistor starts to trip and becomes a large resistance, causing the current to reduce significantly, which turns off transistor 142. Therefore, no current will flow through transistor 142. In this embodiment, a low voltage PTC resistor may be used since the current flows in the PTC resistor is 1/β, times the current in the collector terminal of transistor 142. A detailed description of protection circuit 132 and its variations is disclosed in a co-pending patent application Ser. No. 09/177,666, entitled: "Two-terminal Transistor-PTC Circuit Protection Device", filed on the same day as the present application, which is hereby incorporated by reference. The ninth embodiment functions in a similar manner as the third embodiment shown in FIG. 2A.

Figure 9:
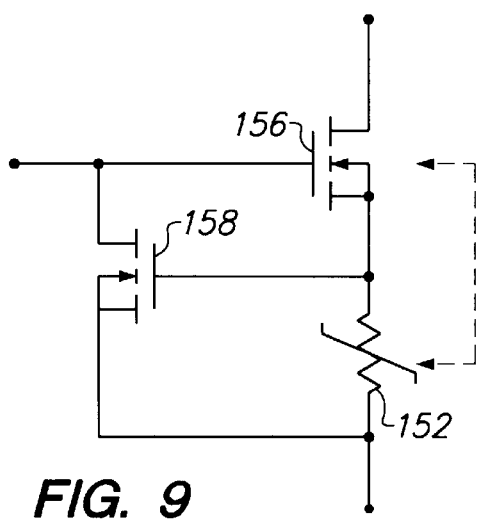
FIG. 9 shows a tenth embodiment according to the present invention.

FIG. 9 shows a tenth embodiment according to the present invention. As illustrated, a PTC resistor 152 has one terminal connected to both a source electrode of an n-channel, enhancement type MOSFET 156 and a gate electrode of a second n-channel, enhancement type MOSFET 158. In addition, PTC resistor 152 has the other terminal connected to a source electrode of MOSFET 158. A drain electrode of MOSFET 158 is connected to a gate electrode of MOSFET 156. An electrical load may be connected to the drain electrode of MOSFET 156.

Under normal conditions, MOSFET 156 is switched on and PTC resistor 152 is conductive so current flows through the PTC resistor. If there is a fault, e.g., a short circuit, and the current in PTC resistor 152 exceeds its hold current, PTC resistor 152 starts to trip and becomes a large resistance. The voltage developed across PTC resistor 152 turns on MOSFET 158, which shuts off MOSFET 156.

By using a PTC resistor instead of a fixed resistor, the reaction time will decrease and a lower voltage PTC resistor can be used. This PTC resistor can be placed inside the FET package and thermally linked to it. In this case, the circuit will provide overcurrent as well as overload and overtemperature protection. The circuit sensitivity will increase. Also, the danger of slow overload conditions is reduced, as the PTC resistor will heat and its resistance will increase.

While the invention has been described in conjunction with several specific embodiments, it is evident to those skilled in the art that many further alternatives, modifications, applications and variations will be apparent in light of the foregoing description. Thus, the invention described herein is intended to embrace all such alternatives, modifications, applications and variations as may fall within the spirit and scope of the appended claims.

What is claimed is:

1. A circuit protection device for protecting an electrical load, comprising:
   a three-terminal switch element having first, second and third terminals, the first terminal for series connecting to the electrical load;
   a positive temperature coefficient (PTC) resistor having first and second ends, the first end connected to the third terminal of said switch element; and
   a voltage divider circuit including first and second resistors, the first resistor connected between a voltage source and the second terminal of said switch element, the second resistor connected between the second terminal of said switch element and the second end of said PTC resistor.

2. The device of claim 1, wherein said switch element is a metal-oxide-semiconductor transistor (MOSFET) and the first, second and third terminals of said switch element are drain, gate and source electrodes, respectively.

3. The device of claim 1, wherein said switch element is a junction field-effect transistor (JFET) and the first, second and third terminals of said switch element are drain, gate and source electrodes, respectively.

4. The device of claim 1, wherein said switch element is a bipolar junction transistor and the first, second and third terminals of said switch element are collector, base and emitter electrodes, respectively.

5. A circuit protection device for protecting an electrical load, comprising:
   a three-terminal switch element having first, second, third and fourth terminals, the first terminal for series connecting to the electrical load;
   a positive temperature coefficient (PTC) resistor having first and second ends, the first end connected to the third terminal of said switch element, the second end for connecting to an AC source;
   a biasing voltage source having positive and negative terminals, the positive terminal connected to the second terminal of said switch element; and
   a rectifier having a first pair of terminals connected between the first and second ends of said PTC resistor and a second pair of terminals connected between the fourth terminal of said PTC resistor and the negative terminal of said biasing voltage source.

6. The device of claim 5, wherein said rectifier is a diode bridge.

7. The device of claim 5, wherein said switch element is a metal-oxide-semiconductor transistor (MOSFET) and the first, second and third terminals of said switch element are drain, gate and source electrodes, respectively.

8. The device of claim 5, wherein said switch element is a junction field-effect transistor (JFET) and the first, second and third terminals of said switch element are drain, gate and source electrodes, respectively.

9. The device of claim 5, wherein said switch element is a bipolar junction transistor and the first, second and third terminals of said switch element are collector, base and emitter electrodes, respectively.

10. A circuit protection device for protecting an electrical load, comprising:
   a first three-terminal switch element having first, second and third terminals, the first terminal for series connecting to the electrical load; and
   a protection element including:
      a second switch element having first, second and third terminals, and a positive temperature coefficient (PTC) resistor coupled between the first and second terminals of said second switch element;
      wherein the first and third terminals of said second switch element are respectively coupled to the third and second terminals of said first switch element.

11. The device of claim 10, wherein said second switch element is a bipolar junction transistor, and the first, second and third terminals of said second switch element are collector, base and emitter electrodes, respectively.

12. The circuit of claim 11, wherein said first switch element is a junction field-effect transistor (JFET), and the first, second and third terminals of said first switch element are drain, gate and source electrodes, respectively.

13. The circuit of claim 11, wherein said first switch element is a metal-oxide-semiconductor transistor (MOSFET) and the first, second and third terminals of said first switch element are drain, gate and source electrodes, respectively.

14. A circuit protection device for protecting an electrical load, comprising:
   a three-terminal switch element having first, second and third terminals;
   a first positive temperature coefficient (PTC) resistor having first and second ends, the first end connected to the third terminal of said switch element; and
   a second PTC resistor having a first end connected to the second terminal of said switch element and a second end connected to the second end of said first PTC resistor.

15. The device of claim 14, wherein said switch element is a metal-oxide-semiconductor transistor (MOSFET) and the first, second and third terminals of said switch element are drain, gate and source electrodes, respectively.

16. The device of claim 14, wherein said switch element is a junction field-effect transistor (JFET) and the first, second and third terminals of said switch element are drain, gate and source electrodes, respectively.

17. The device of claim 14, wherein said switch element is a bipolar junction transistor and the first, second and third terminals of said switch element are collector, base and emitter electrodes, respectively.

18. The device of claim 14, further comprising a rectifier connected to the first terminal of said switch element.

19. The device of claim 18, wherein said rectifier is a first diode having positive and negative terminals, the negative terminal connected to the first terminal of said switch element.

20. The device of claim 19, further comprising:
   a second switch element having first, second and third terminals, a third PTC resistor having first and second ends, the first end connected to the third terminal of said second switch element;
   a fourth PTC resistor having a first end connected to the second terminal of said second switch element and a second end connected to the second end of said fourth PTC resistor; and
   a second diode having positive and negative terminals, the negative terminal of said second diode connected to the first terminal of said second switch element;
   wherein the positive terminal of said first diode is connected to the second end of said third PTC resistor;
   wherein the positive terminal of said second diode is connected to the second end of said first PTC resistor.

21. The device of claim 14, further comprising a rectifier coupled between the first terminal of said switch element and the second end of said second PTC resistor.

22. The device of claim 21, wherein said rectifier is a diode bridge.

23. A circuit protection device for protecting an electrical load, comprising:
   a three-terminal switch element having first, second and third terminals, the first terminal for series connecting to the electrical load;
   a first positive coefficient temperature (PTC) resistor having first and second ends, the first end connected to the third terminal of said switch element;
   a second PTC resistor having first and second ends, the first end of said second PTC resistor connected to the second terminal of said switch element; and
   a voltage divider circuit including:
      a first resistor connected between a voltage source and the second end of said second PTC resistor, and
      a second resistor connected between the second ends of said first and second PTC resistors.

24. The device of claim 23, wherein said switch element is a metal-oxide-semiconductor transistor (MOSFET) and the first, second and third terminals of said switch element are drain, gate and source electrodes, respectively.

25. The device of claim 23, wherein said switch element is a junction field-effect transistor (JFET) and the first, second and third terminals of said switch element are drain, gate and source electrodes, respectively.

26. The device of claim 23, wherein said switch element is a bipolar junction transistor and the first, second and third terminals of said switch element are collector, base and emitter electrodes, respectively.

27. A circuit protection circuit for protecting an electrical load, comprising:
   a first three-terminal switch element having first, second and third terminals, the first terminal for series connecting to the electrical load;
   a second three-terminal switch element having first, second and third terminals, the first terminal of said second switch element connected to the second terminal of said first switch element, the second terminal of said second switch element connected to the third terminal of said first switch element; and
   a positive temperature coefficient (PTC) resistor having a first end connected to the third terminal of said first switch element and a second end connected to the third terminal of said second switch element.

28. The device of claim 27, wherein said first and second switch elements are metal-oxide-semiconductor transistors (MOSFETs) and the first, second and third terminals of said first and second switch elements are drain, gate and source electrodes, respectively.

29. The device of claim 27, wherein said first and second switch elements are junction field-effect transistors (JFETs) and the first, second and third terminals of said first and second switch elements are drain, gate and source electrodes, respectively.

30. The device of claim 27, wherein said first and second switch elements are bipolar junction transistors and the first, second and third terminals of said first and second switch elements are collector, base and emitter electrodes, respectively.

31. A method for protecting an electrical load, comprising the steps of:

providing a three-terminal switch element having first, second and third terminals, the first terminal for series connecting to the electrical load;

connecting a first end of a positive temperature coefficient (PTC) resistor to the third terminal of said switch element;

connecting a first resistor of a voltage divider between a voltage source and the second terminal of said switch element; and connecting a second resistor of said voltage divider between the second terminal of said switch element and a second end of said PTC resistor.

32. A method for protecting an electrical load, comprising the steps of:

providing a three-terminal switch element having first, second and third terminals;

connecting a first end of a first positive temperature coefficient (PTC) resistor to the third terminal of said switch element;

connecting a first end of a second PTC resistor to the second terminal of said switch element; and connecting a second end of said second PTC resistor to the second end of said first PTC resistor.

33. A method for protecting an electrical load, comprising the steps of:

providing a three-terminal switch element having first, second and third terminals, the first terminal for series connecting to the electrical load;

connecting a first end of a first positive coefficient temperature (PTC) resistor to the third terminal of said switch element; connecting a first end of a second PTC resistor to the second terminal of said switch element;

connecting a first resistor of a voltage divider between a voltage source and a second end of said second PTC resistor; and connecting a second resistor of said voltage divider between the second ends of said first and second PTC resistors.

34. A method for protecting an electrical load, comprising the steps of:

providing a first three-terminal switch element having first, second and third terminals, the first terminal for series connecting to the electrical load; connecting a first terminal of a second three-terminal switch element to the second terminal of said first switch element;

connecting a second terminal of said second switch element to the third terminal of said first switch element;

connecting a first end of a positive temperature coefficient (PTC) resistor to the third terminal of said first switch element; and connecting a second end of said PTC resistor to the third terminal of said second switch element.

* * * * *